United States Patent [19]

Holtslander

[11] Patent Number: 4,878,011
[45] Date of Patent: Oct. 31, 1989

[54] PROPORTIONAL FIRING CIRCUIT

[75] Inventor: Roger A. Holtslander, Mount Clemens, Mich.

[73] Assignee: Wolf Engineering Corporation, Dearborn, Mich.

[21] Appl. No.: 226,224

[22] Filed: Jul. 29, 1988

[51] Int. Cl.⁴ .......................... G05B 24/02; G05F 1/46
[52] U.S. Cl. ...................................... 323/319; 323/323
[58] Field of Search ................. 323/319, 320, 322, 323, 323/902, 910

[56] References Cited

U.S. PATENT DOCUMENTS

| | | |
|---|---|---|
| 3,050,611 | 8/1962 | Kamide . |
| 3,154,695 | 10/1964 | MacGregor et al. . |
| 3,200,296 | 8/1965 | Bruestle . |
| 3,319,152 | 5/1967 | Pinckaers . |
| 3,566,151 | 2/1971 | Wilburn . |
| 3,671,849 | 6/1972 | Kingston . |
| 3,696,288 | 10/1972 | Carman . |
| 3,752,956 | 9/1973 | Cahill et al. . |
| 3,764,890 | 10/1973 | Caen . |
| 3,780,318 | 12/1973 | Werts et al. . |
| 3,816,763 | 6/1974 | Korn et al. . |
| 3,821,516 | 6/1974 | Hayes et al. . |
| 3,846,824 | 11/1974 | Bell . |
| 3,855,452 | 12/1974 | Flasza et al. . |
| 3,881,091 | 4/1975 | Day . |
| 3,940,634 | 2/1976 | Grogan . |
| 3,956,644 | 5/1976 | Zambre .................. 323/319 |
| 4,072,880 | 2/1978 | Oshima et al. . |
| 4,121,149 | 10/1978 | Seltzer ..................... 323/323 |
| 4,158,150 | 6/1979 | Dever . |
| 4,167,696 | 9/1979 | Gyursanszky . |
| 4,172,272 | 10/1979 | Schneider . |
| 4,176,288 | 11/1979 | Komatsu et al. . |
| 4,223,207 | 9/1980 | Chow . |
| 4,243,894 | 1/1981 | Kuntner et al. . |
| 4,287,468 | 9/1981 | Sherman .................. 323/319 |
| 4,344,106 | 8/1982 | West et al. . |
| 4,382,271 | 5/1983 | Villemont et al. . |
| 4,424,439 | 1/1984 | Payne et al. . |
| 4,426,615 | 1/1984 | Hannas ..................... 323/319 |
| 4,618,817 | 10/1986 | Holtslander ............... 323/319 |

Primary Examiner—Peter S. Wong
Attorney, Agent, or Firm—Harness, Dickey & Pierce

[57] ABSTRACT

A relay control circuit which is capable of reliably controlling the transmission of electrical power in very small time increments. Specifically, the present invention features a proportional firing circuit which will create an SCR firing signal whose pulse timing is proportional to the magnitude of a variable input signal. The control circuit varies the conduction time for the SCRs by varying the time between firing signal pulses of fixed duration.

13 Claims, 3 Drawing Sheets

100% ON — CYCLE TIME .0833 SEC

75% ON — CYCLE TIME .1042 SEC

50% ON — CYCLE TIME .1250 SEC

25% ON — CYCLE TIME .2083 SEC

PROPORTIONAL FIRING CIRCUIT

BACKGROUND AND SUMMARY OF THE INVENTION

The present invention relates generally to electronic relays and to techniques for controlling the temperature of electrical resistance heater elements through such electronic relays. More particularly, the present invention relates to a proportional firing circuit for electronic relays which is capable of precisely controlling the time during which electrical power is transmitted to a load, such as a resistance heater element.

Industrial plastic processing machines utilize multi-phase electricity as an energy source to generate heat for melting and/or maintaining plastic in a molten state. The electricity is converted into thermal energy by electrical resistance heating elements which are located on a molten plastic vessel associated with the molding machine. The temperature of the molten plastic is controlled by selectively turning on and off the electrical power supply to the electrical resistance heating elements. In conventional industrial plastic processing machines the electrical power is switched on and off by electromagnetic relays having mechanical contacts. Each phase of the electrical supply is switched by individual pairs of contacts.

Heat control using electromagnetic relays is capable of reliably maintaining molten plastic at a temperature range of minus zero, plus seven degrees F. Operating in such a temperature range, the relays are cycled approximately once per minute. To realize more accurate temperature control, the relays must be cycled on and off more frequently. For example, minus zero, plus one degree F. temperature regulation may be realized if the relays are cycled approximately once per second. Such high frequency relay cycling raises the operating temperature of the relay contacts and reduces the life of the contacts.

An electronic relay which overcomes the disadvantages of prior electromagnetic relays is described in U.S. Pat. No. 4,618,817. This patent issued on Oct. 21, 1986 to the present inventor and is commonly assigned. This patent is hereby incorporated by reference. The electronic relay of this patent is capable of being rapidly cycled many millions of times over its useful life. The electronic relay of this patent utilizes silicon controlled rectifier ("SCR") modules to control the transmission of electrical power from a multi-phase power supply to a heating element or other suitable load. Each SCR module includes a zero crossing detector to coordinate the firing or gating signal for the SCRs contained in the module with zero crossing junctions in the power supply.

In order to more fully utilize the capabilities of this type of electronic relay, the present invention provides a relay control circuit which is capable of reliably controlling the transmission of electrical power in very small time increments. Specifically, the present invention features a proportional firing circuit which will create an SCR firing signal whose pulse timing is proportional to the magnitude of a variable input signal. Accordingly, this proportional firing circuit will enable the conduction time of the SCRs to be proportionally varied between a minimum conduction time which is associated with the cycling of the power supply (e.g., 2.5 cycles "ON" time in the period of a second) and a maximum conduction time (e.g., full ON).

In accordance with one aspect of the present invention, the control circuit varies the conduction time for the SCRs by varying the time between firing signal pulses of fixed duration. Thus, for example, the duration of the firing signal pulse may be fixed at 2.5 cycles of a 60Hz A.C. power supply, and the "OFF" time between these pulses may be varied from approximately 1 second to 0.5 cycles before a full on state is achieved.

Importantly, the control circuit of the present invention will provide a response relative to the cycles of the power supply which is proportional to the variable characteristic of the input signal. This precise control over the transmission of electrical power will enable a suitable load, such as an electrical resistance heater element to maintain an essentially constant temperature which is desired for optimum processing of a plastic part.

Another advantage of the present invention is its ability to act as an open loop controller in the place of other controllers which cannot offer the same level of precision in its operation. The pulse timing response of the present invention also has the advantage of extending the life of the load that it is driving, because this form of operation is less stressful on the load.

In one form of the present invention, the control circuit includes a 555 timer integrated circuit, and a variable resistor circuit which provides the variable signal used to control the conduction time of the SCRs. The variable resistor circuit may be either a potentiometer or a circuit component whose resistance varies in response to an input signal. The 555 timer is provided with the appropriate timing components, such that it will generate a firing signal whose pulse cycle time is proportional to the magnitude of a variable input signal.

Additional advantages and features of the present invention will become apparent from a reading of the detailed description of the preferred embodiment which makes reference to the following set of drawings in which:

DETAILED DESCRIPTION OF THE PREFERRED EMBODIMENT

Figure 1:
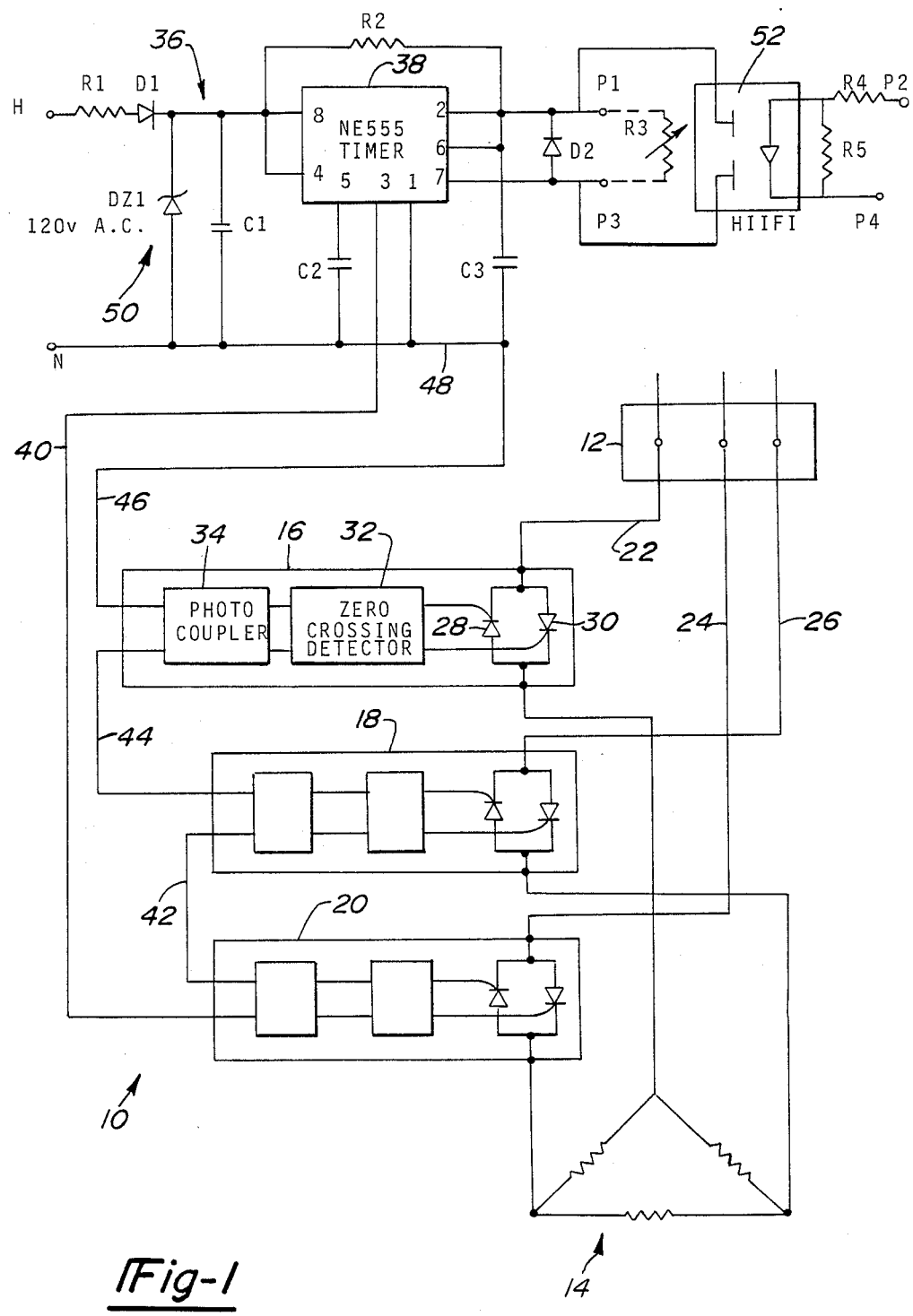
FIG. 1 is a circuit diagram of a control circuit for a multi-phase switching apparatus according to the present invention.

Referring to FIG. 1, a schematic diagram of a multi-phase switching apparatus control circuit 10 according to the present invention is shown. The control circuit 10 is used to control the transmission of electrical power from a three-phase electrical power supply 12 to a resistive load 14. In this regard, the control circuit 10 includes three SCR modules 16, 18 and 20, one for each of the three phases (22, 24 and 26) of the power supply 12. As discussed in U.S. Pat. No. 4,618,817, each of the SCR modules 16-20 include a pair of inverse parallel connected SCRs 28-30, so that the transmission of both positive and negative halves of the alternating current waveform of the power supply 12 may be appropriately controlled.

Each of the SCR modules 16–20 is also provided with a zero crossing detector circuit 32 and a photocoupling circuit 34 for conditioning the firing signal provided to the gate terminals of the SCRs 28–30. The photocoupling circuit 34 is used to provide optical isolation for the firing signal input to the SCR module. The zero crossing detector circuit 32 receives the firing signal through the photocoupling circuit 34, and permits the conduction of the SCRs only at zero crossing junctions in the alternating cycle of the power supply 12.

In the preferred form of the invention, the SCR modules 16–20 each comprise a crydom D2440 solid state relay. However, it should be appreciated that the principles of the present invention are not limited to this specific module construction, and that other suitable semiconductor controlled rectifiers may be used in the appropriate application. Thus, for example, a triac or other suitable thyristor based controlled conduction device may be used in place of the SCRs 28–30.

The control circuit 10 features a proportional firing circuit which is generally designated by the reference numeral 36. The proportional firing circuit 36 includes a 555 timer integrated circuit chip 38 which generates a firing signal output from pin 3. The firing signal output is communicated to the SCR modules 16–20 via conductor 40. In this regard, the control inputs of each of the SCR modules 16–20 are connected in series through conductors 42, 44 and 46. The conductor 46 is then connected back to the electrical ground of the proportional firing circuit 36, which is represented by conductor 48.

While the timer chip 38 may be provided with any electrical power source from four to fifteen volts, FIG. 1 shows that this chip receives power from a 120 volt AC power supply at the terminals labeled "H" and "N". In order to make this voltage supply usable by the timer chip 38, the proportional firing circuit 36 includes a power conditioning circuit, which is generally designated by the reference numeral 50. The power conditioning circuit 50 is generally comprised of resistor R1, diode D1, zener diode DZ1 and capacitor C1. The resistor R1 provides a stepdown resistor, while the diode D1 provides halfwave rectification of the alternating current power supply. The zener diode DZ1 and the capacitor C1 are connected in parallel to produce a regulated level DC voltage across the power supply pin 8 and ground pin 1 of the timer chip 38. In this regard, it should be noted that the capacitor C2 connected to pin 5 of the timer chip 38 provides an optional bypass capacitor to ground via conductor 48.

As will be more fully appreciated below, the timer chip 38 is configured to generate a firing signal for the SCRs whose pulse timing is proportional to the magnitude of a variable input signal. This circuit arrangement will enable the conduction time of the SCRs to be proportionally varied between a minimum conduction time which is associated with the cycling of the alternating power supply 12 and a maximum conduction time. This circuit arrangement includes a resistor R2 which is connected between pins 8 and 2 of the timer chip 38, and a timing capacitor C3 which is connected between pins 6 and 1 of the timer chip. The variable input signal to the timer chip 38 is generally represented as a variable resistor value across the diode D2. As shown in FIG. 1, the diode D2 is connected at one end to both pins 2 and 6 of the timer chip 38 and at the other end to the pin 7 of this timer chip. In this regard, the diode D2 serves the function of a reverse shunt to avoid spikes and other voltages from building up on pin 7 of the timer chip 38.

In one embodiment according to the present invention, the variable resistance value input may be provided by connecting a potentiometer R3 across terminals "P1" and "P3". Alternatively, an optical coupler circuit 52 may be connected across the diode D2 as a way of providing a circuit component whose output resistance will vary in accordance with an input signal received at terminals "P2" and "P4". In this regard, balancing resistors R4 and R5 are connected between the optical coupler circuit 52 and the terminals P2 and P4 to enable the variable characteristic of the input signal to be either a variable voltage or a variable current.

For example, in one form of the present invention, it is preferred that the variable input signal be either a voltage signal whose voltage level varies between one and five volts, or a current signal whose current level varies between four and twenty milliamps. In order that such a voltage signal will have direct correspondence in value to such a current signal, the balancing resistors R4 and R5 should be selected to provide an approximately 250 ohm input impedance. In this situation, a one volt input signal will correspond to a four milliamp current signal, and a five volt input signal will correspond to a twenty milliamp current signal. Thus, it should be appreciated that the proportional firing circuit 36 is adapted to receive three different types of input signals, namely a variable voltage signal, a variable current signal and a direct variable resistance value.

It should be appreciated from the above that the variable resistance across diode D2 combines with the other timing components connected to the timer chip 38, namely resistor R2 and capacitor C3, to control the firing signal generated by the timer chip. Specifically, it will be shown that the timer chip 38 generates a pulse signal whose cycle time between each pulse is variable. In other words, the duration of the pulse itself is held constant, but the "OFF" time between these pulses is varied in proportion to the variable characteristic of the input signal.

Figure 2:
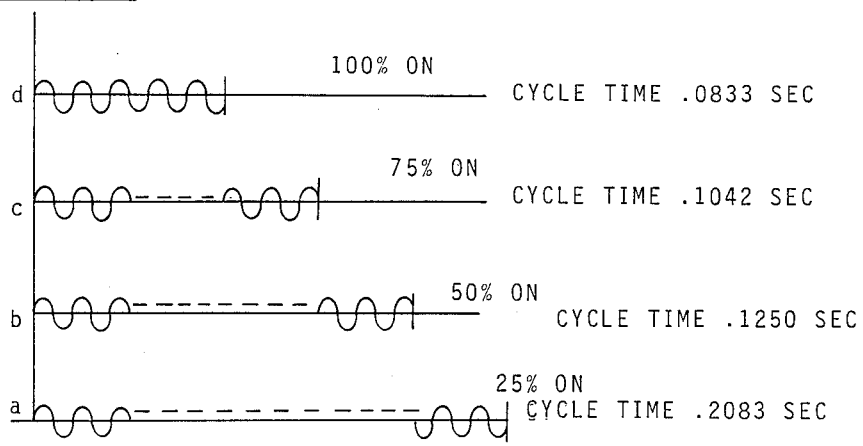
FIG. 2 is a timing diagram which illustrates the operation of the control circuit according to FIG. 1.

Referring to FIG. 2, a timing diagram is shown which illustrates the operation of the control circuit 10 according to the present invention. Specifically, FIG. 2 illustrates the transmission of electrical power through one of the SCR modules 16–20 to one phase of the resistive load 14 in response to four different input signal conditions. For example, timing diagram "a" illustrates the transmission of electrical power when the input signal is adjusted to transmit only 25% of the available power to the resistive load 14. In other words, the SCRs 28–30 will be in a conduction or "ON" state for 25% of the time. Similarly, timing diagram "b" illustrates a condition in which the SCRs 28–30 will be ON 50% of the time, and timing diagram "c" illustrates the condition in which these SCRs will be ON 75% of the time. Finally, timing diagram "d" illustrates a condition in which the SCRs 28–30 will be on 100% of the time.

It is important to note from FIG. 2 that the timer chip 38 will generate a firing signal with a fixed pulse duration and a variable cycle time. Thus, for example, the timing diagram "a" illustrates that the pulse duration in one form of the present invention corresponds to 2.5 cycles of the 60Hz AC power supply 12. In this regard, it should be appreciated that the pulse duration of the firing signal on conductor 40 in FIG. 1 will cooperate with the zero crossing circuits 32, so that the actual duration of transmitted electrical power will be expressed in terms of half cycles of the power supply waveform.

Continuing with FIG. 2, the timing diagrams "a"-"d" illustrate that the "OFF" time between each of the firing signal pulses may be varied from a "full ON" maximum conduction time to a "minimum" conduction time of 2.5 cycles within some extended period of time (e.g., a period of more than one second). Thus, FIG. 2 illustrates the cycle times which correspond to each of the timing diagrams "a"-"d". In this regard, the cycle time is assumed to extend between the beginning of one firing signal pulse and the end of the next firing signal pulse. In terms of the magnitude of the input signal at terminals "P2" and "P4" of the proportional firing circuit 36, it should be noted that the "full ON" condition could correspond to a 5 volt/20 milliamp signal, while a "full OFF" condition could correspond to a 1 volt/4 milliamp input signal. It should also be noted that the variable cycle time provided by the present invention avoids the difficulty of trying to proportion both the "ON" and "OFF" time to maintain a fixed cycle time form of operation. While the preferred form of the present invention provides a fixed pulse duration of 2.5 cycles relative to a 60Hz AC power supply, it should be appreciated that other suitable pulse durations may be employed in the appropriate application.

The table set forth below provides one set of parameter values for the circuit components of the proportional firing circuit 36 shown in FIG. 1. These parameter values are set forth for exemplary purposes, and are not intended to limit the invention. Similarly, it should be appreciated that the present invention is not limited to the specific 555 timer chip 38 used in the preferred embodiment. While it is believed that the use of a 555 timer chip is particularly advantageous in the proportional firing circuit 36 according to the present invention, other suitable timer/multivibrator circuits may be useful in the appropriate application.

TABLE

| Component | Value/Part No. |
|---|---|
| R1 | 4.1K ohms |
| R2 | 27K ohms |
| R3 | 1 Meg. linear pot. |
| R4 | approximately 100 ohms |
| R5 | 180 ohms |
| C1 | 47 micro farad |
| C2 | .01 pico farad |
| C3 | 2.2 pico farad |
| D1 | 1N4003 |
| D2 | 1N4003 |
| DZ1 | 1N4740 |

Figure 3:
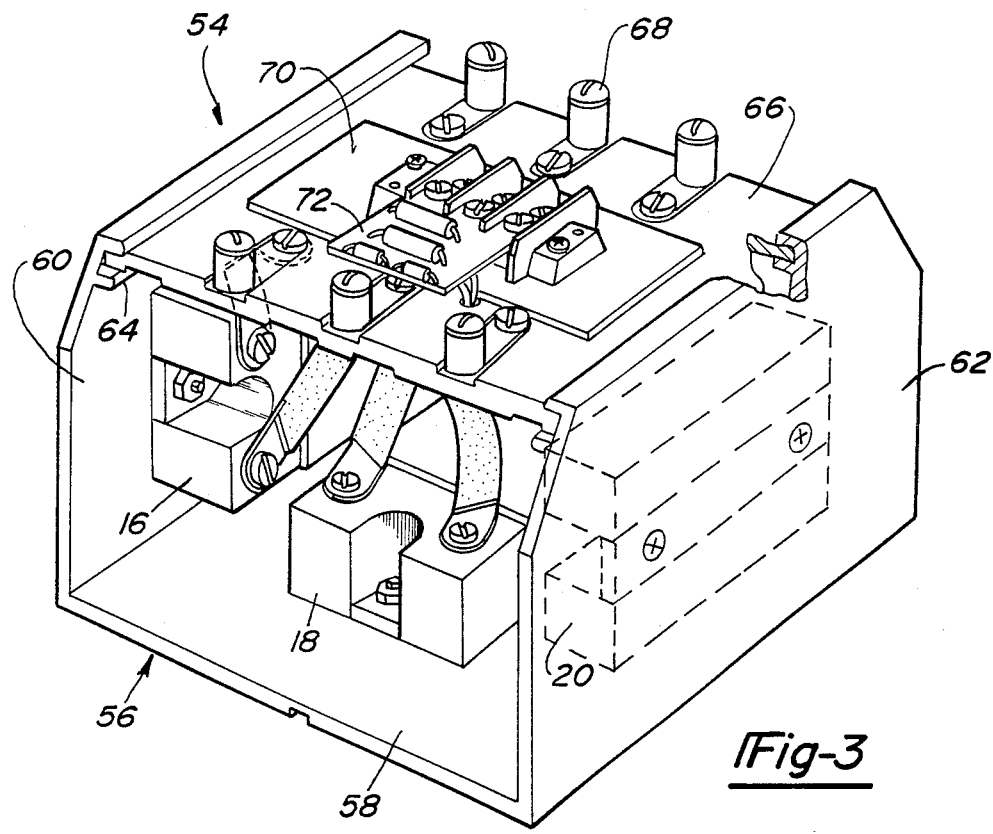
FIG. 3 is a perspective view of a multi-phase electrical switching apparatus which may be employed in conjunction with the present invention.
Figure 4:
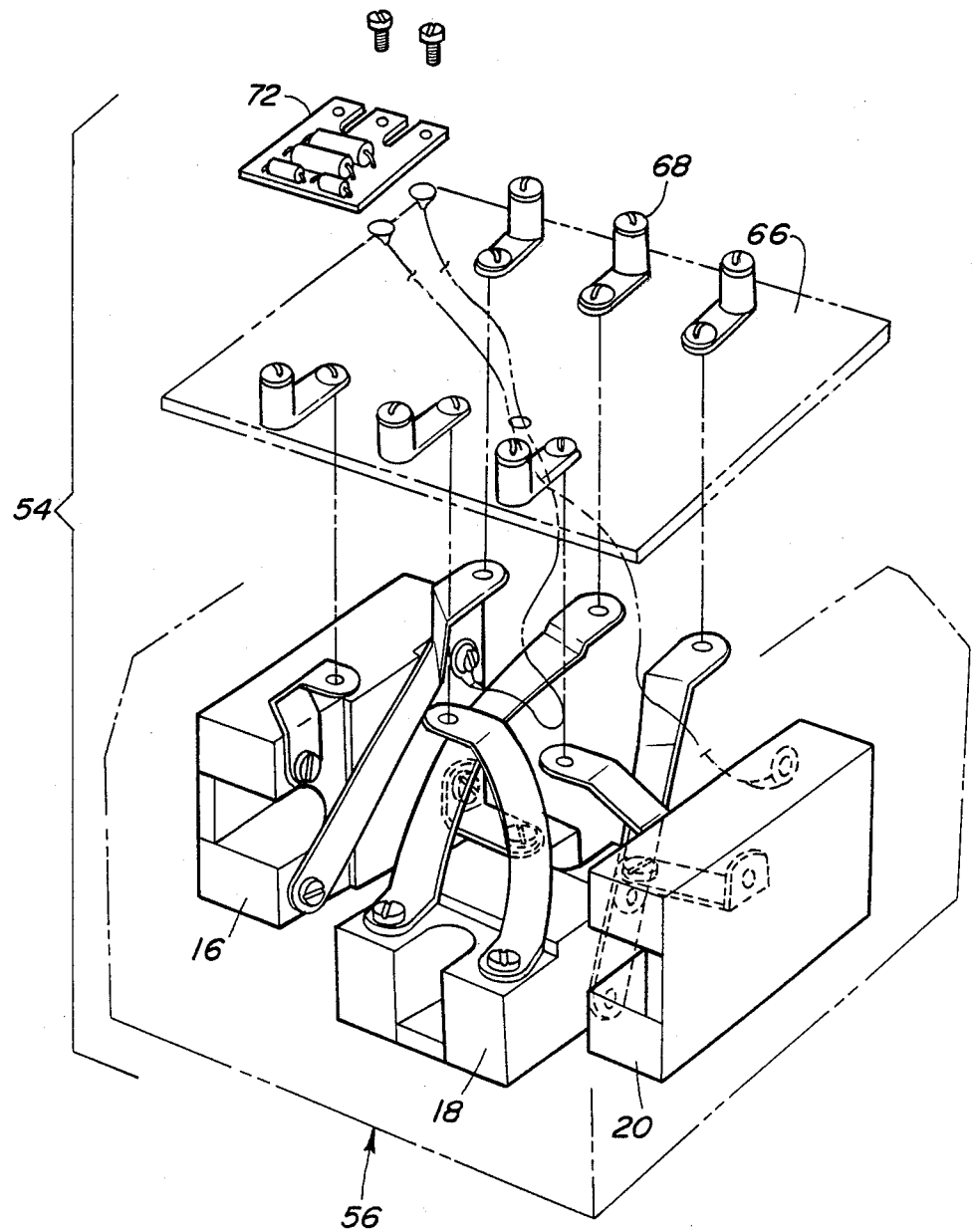
FIG. 4 is another view of the multi-phase electrical switching apparatus according to FIG. 3.

Referring to FIGS. 3 and 4, two views of a multiphase electrical switching apparatus 54 is shown. The electronic switching apparatus 54, sometimes referred to herein as the electronic relay, is similar to that shown in U.S. Pat. No. 4,618,817 identified above. One of the principle differences between these electronic relays is that the relay 54 is constructed with three SCR modules 16–20, whereas the electronic relay described in the above referenced patent utilized only two such SCR modules.

The electronic relay 54 includes an aluminum frame 56, which is generally comprised of a rectangular base section 58 and two perpendicular support sections 60–62 extending from opposite sides of the base section 58. Each of the support sections 60–62 is provided with a generally C-shaped flange 64 which extends along the horizontal top edge of these sections. The flanges 64 are adapted to support an electrically nonconductive platform 66. The platform 66 is used for supporting a plurality of terminals 68 for connecting the relay 54 between the power supply 12 and the load 14. The platform 66 also supports a terminal board 70, which in turn supports a circuit board 72. The circuit board 72 generally contains the logic conditioning circuit disclosed in U.S. Pat. No. 4,618,817. However, a circuit board containing the proportional firing circuit 36 according to the present invention may also be mounted in its place.

FIG. 3 also illustrates that the SCR module 16 is mounted to the support section 60, and that the SCR module 20 is mounted to the support section 62. Similarly, FIG. 3 shows that the SCR module 18 is mounted to the base section 58 of the frame 56. FIG. 4 particularly illustrates the electrical connections between the SCR modules 16–20 and the power terminals 68, and the electrical connections between the circuit board 72 and these SCR modules. As discussed in the above referenced patent, such an electronic relay structure is very space efficient, while facilitating rapid heat transfer from the relay.

It will be appreciated that the above disclosed embodiment is well calculated to achieve the aforementioned objects of the present invention. In addition, it is evident that those skilled in the art, once given the benefit of the foregoing disclosure, may now make modifications of the specific embodiment described herein without departing from the spirit of the present invention. Such modifications are to be considered within the scope of the present invention which is limited solely by the scope and spirit of the appended claims.

What is claimed is:

1. In an electrical switching apparatus having semiconductor controlled rectifier means for controlling the transmission of electrical power from an alternating power supply, a proportional firing circuit comprising:
   input means for providing a variable signal whose magnitude is used to control the conduction of said semiconductor controlled rectifier means;
   timer means for generating a firing signal for said semiconductor controlled rectifier means whose pulse timing is proportional to the variable characteristic of said variable signal, so as to enable the conduction time of said semiconductor controlled rectifier means to be proportionally varied between a minimum conduction time which is associated with the cycling of said alternating power supply and a maximum conduction time; and
   zero crossing means receiving said firing signal of said timer means for permitting the conduction of said semiconductor controlled rectifier means only at zero crossing junctions in the alternating cycle of said power supply;
   wherein said firing signal has a fixed pulse duration, and only the time between the pulses of said firing signal is varied in response to said variable input signal.

2. The electrical switching apparatus according to claim 1, wherein said input means includes a variable resistor component.

3. The electrical switching apparatus according to claim 2, wherein said variable resistor component is a potentiometer.

4. The electrical switching apparatus according to claim 2, wherein said variable resistor component is an optical coupler, and said input means includes balanced resistor means connected to said optical coupler to enable the variable characteristic of the input signal to be either a variable voltage or a variable current.

5. The electrical switching apparatus according to claim 1, wherein said timer means includes a multivibrator component and RC timing components connected to both said multivibrator component and said input means.

6. The electrical switching apparatus according to claim 5, wherein said multivibrator component generally comprises a 555 timer integrated circuit.

7. The electrical switching apparatus according to claim 1, wherein said semiconductor controlled rectifier means comprises a pair of inverse parallel connected silicon controlled rectifiers for each phase of said alternating power supply.

8. A multi-phase electrical switching apparatus circuit, comprising:
   a pair of inverse parallel connected semiconductor controlled rectifiers for at least two phases of a multi-phase electrical power supply;
   zero crossing means connected to the gate terminals of each of semiconductor controlled rectifier pairs for permitting the conduction of said semiconductor controlled rectifiers only at zero crossing junctions in the alternating cycle of said power supply; and
   proportional firing means for generating a firing signal for said semiconductor controlled rectifiers whose pulse timing is proportional to the magnitude of a variable input signal, so as to enable the conduction time of said semiconductor controlled rectifiers to be proportionally varied between a minimum conduction time which is associated with the cycling of said electrical power supply and a maximum conduction time;
   wherein said firing signal has a fixed pulse duration, and only the time between the pulses of said firing signal is varied in response to said variable input signal.

9. The multi-phase electrical switching apparatus circuit according to claim 8, wherein a pair of inverse parallel connected semiconductor controlled rectifiers is provided for each phase of said electrical power supply.

10. The multi-phase electrical switching apparatus circuit according to claim 8, wherein said semiconductor controlled rectifiers are silicon controlled rectifiers.

11. The multi-phase electrical switching apparatus circuit according to claim 8, wherein said variable input signal is provided through a variable resistor.

12. The multi-phase electrical switching apparatus circuit according to claim 11, wherein said proportional firing means includes a multivibrator component and a timing capacitor which is connected to both said multivibrator component and said variable resistor.

13. The multi-phase electrical switching apparatus circuit according to claim 12, wherein said variable resistor includes an optical coupler whose resistance is variable, and balanced resistor means is connected to said optical coupler to enable the variable characteristic of the input signal to be either a variable voltage or a variable current.

* * * * *